(12) United States Patent
Morgan et al.

(10) Patent No.: US 10,564,666 B2
(45) Date of Patent: Feb. 18, 2020

(54) CLOCK-CONTROLLED CIRCUITRY

(71) Applicant: Cirrus Logic International Semiconductor Ltd., Edinburgh (GB)

(72) Inventors: Ross Morgan, Bathgate (GB); Shantanu Shrikant Nalage, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/366,907

(22) Filed: Mar. 27, 2019

(65) Prior Publication Data

US 2019/0302832 A1 Oct. 3, 2019

Related U.S. Application Data

(60) Provisional application No. 62/649,783, filed on Mar. 29, 2018.

(30) Foreign Application Priority Data

Sep. 17, 2018 (GB) .................................. 1815105.0

(51) Int. Cl.
*G06F 1/12* (2006.01)
*H03K 3/037* (2006.01)
(Continued)

(52) U.S. Cl.
CPC .................. *G06F 1/12* (2013.01); *G06F 1/06* (2013.01); *H03K 3/037* (2013.01); *H03K 21/08* (2013.01); *H04R 3/00* (2013.01)

(58) Field of Classification Search
None
See application file for complete search history.

(56) References Cited

U.S. PATENT DOCUMENTS

| 7,945,803 | B2 * | 5/2011 | Jones .................... G06F 1/04 |
| | | | 713/500 |
| 8,996,906 | B1 | 3/2015 | Townley et al. |
| 9,954,530 | B2 * | 4/2018 | Ebeling ............... H03K 19/173 |

FOREIGN PATENT DOCUMENTS

GB 2426164 A 11/2006

OTHER PUBLICATIONS

Combined Search and Examination Report under Sections 17 and 18(3), UKIPO, Application No. GB1815105.0, dated Oct. 25, 2018.

* cited by examiner

*Primary Examiner* — Jeffery S Zweizig
(74) *Attorney, Agent, or Firm* — Jackson Walker L.L.P.

(57) ABSTRACT

Clock-controlled circuitry organised into at least first and second clock domains, the first clock domain configured to operate based on a first clock signal and the second clock domain configured to operate based on a second clock signal, wherein: the first clock domain comprises a first signal generator operable to generate a first repetitive signal synchronised to the first clock signal; the second clock domain comprises a second signal generator operable to generate a second repetitive signal synchronised to the second clock signal; the first signal generator is operable, when operating in master mode, to output to the second signal generator a first synchronisation signal indicative of a phase of the first repetitive signal; and the second signal generator is operable, when operating in slave mode, to: set a timing of the second repetitive signal relative to the second clock signal based on the first synchronisation signal so that the second repetitive signal is set to have a phase relationship with the first repetitive signal which then meets a slave specification; and re-set the timing of the second repetitive signal relative to the second clock signal if it is determined (Continued)

that the phase relationship has changed such that it no longer meets the slave specification.

20 Claims, 6 Drawing Sheets

(51) Int. Cl.
*H04R 3/00* (2006.01)
*G06F 1/06* (2006.01)
*H03K 21/08* (2006.01)

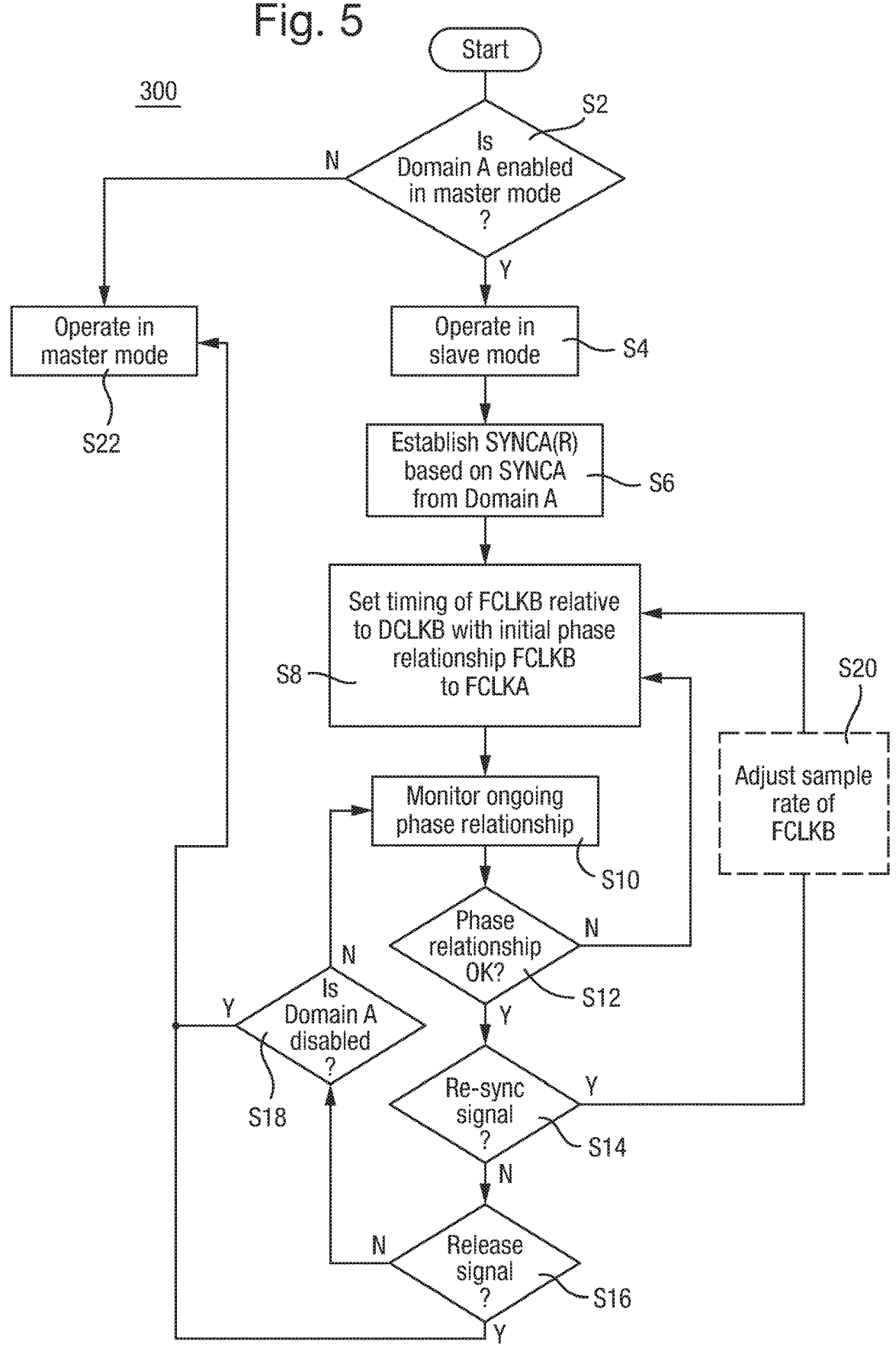

CLOCK-CONTROLLED CIRCUITRY

The present disclosure claims priority to U.S. Provisional Patent Application Ser. No. 62/649,783, filed Mar. 29, 2018, and United Kingdom Patent Application No. 1815105.0, filed Sep. 17, 2018, each of which is incorporated by reference herein in its entirety.

TECHNICAL FIELD

The present disclosure relates to clock-controlled circuitry, and in particular to the timing of signals between clock domains of such circuitry. Such timing may affect the transfer of data from one such domain to the other.

BACKGROUND

Clock-controlled circuitry may be organised into a plurality of clock domains, where different clock domains operate based on their own clock signals. The clock signals of such different clock domains may be related in some way—for example, they may be derived ultimately from the same global or master clock signal. However, typically different clock domains have clock signals which have different frequencies and/or phases from one another, or phases and/or frequencies which are only nominally (e.g. to differing accuracies) the same. As such, a relationship between the clock signals of different clock domains may vary over time and may be unpredictable or unreliable. Such an architecture may be described in overview as a Global Asynchronous Locally Synchronous (GALS) architecture. One advantage of a GALS architecture may be that the overall amount of clock-tree balancing required may be reduced as compared to an architecture with only a single clock domain. Also, in a GALS architecture it may be possible to control which domains are on and which are off over time, with the domains then acting as power and clock domains.

Where data is transferred from one clock domain to another, timing between those domains can be important. Where the data is for example audio data, which may be packaged in frames and which may need to be handled in a time-critical manner (such as on a real-time basis), it may be desirable to minimize or reduce group delay or avoid audio artefacts related to clock domain crossing to improve end-user experience.

Clock-controlled circuitry naturally finds wide use. For example, most integrated circuits (ICs) use one or more clock signals to synchronise or otherwise control different parts of system circuitry. Circuits operating based on clock signals may be considered synchronous circuits. Examples include processing circuits such as audio-processing circuits (which may handle data such as audio data).

Clock-controlled circuitry may therefore be implemented on ICs or systems within a host device, which may be considered an electrical or electronic device. Examples include a portable and/or battery powered host device such as a mobile telephone, an audio player, a video player, a PDA, a mobile computing platform such as a laptop computer or tablet and/or a games device.

Of course, audio data is merely one example type of data where timing issues can be important in relation to clock domain crossing. Other examples may include video or sensor/transducer (e.g. haptics) data. For convenience, however, the example of audio data will be carried forward herein.

Existing clock-controlled circuitry has been found to have shortcomings, in particular when data is passed or streamed from one clock domain to another. It is desirable to provide improved clock-controlled circuitry, in which data (such as audio data) may be transferred from one clock domain to another in an efficient manner.

SUMMARY

According to a first aspect there is provided clock-controlled circuitry organised into at least first and second clock domains, the first clock domain configured to operate based on a first clock signal and the second clock domain configured to operate based on a second clock signal, wherein: the first clock domain comprises a first signal generator operable to generate a first repetitive signal synchronised to the first clock signal; the second clock domain comprises a second signal generator operable to generate a second repetitive signal synchronised to the second clock signal; the first signal generator is operable, when operating in master mode, to output to the second signal generator a first synchronisation signal indicative of a phase of the first repetitive signal; and the second signal generator is operable, when operating in slave mode, to: set a timing of the second repetitive signal relative to the second clock signal based on the first synchronisation signal so that the second repetitive signal is set to have a phase relationship with the first repetitive signal which then meets a slave specification; and re-set the timing of the second repetitive signal relative to the second clock signal if it is determined that the phase relationship has changed such that it no longer meets the slave specification.

In this way, it is possible to keep the phase relationship within bounds defined by the slave specification, which can be advantageous where interrelated processes are defined by the first and second repetitive signals. For example, it may be that data transfer between the first and second clock domains is governed by the first and second repetitive signals, and in particular the relationship between them. By keeping the phase relationship within bounds defined by the slave specification, it may be that such data transfer can occur without significant errors and with reduced or minimised latency.

The slave specification may be or comprise one or more parameter values, which may define an allowable range of phase differences between the first and second repetitive signals. The slave specification may also define such a phase difference to be achieved when the timing of the second repetitive signal relative to the second clock signal is set.

The second signal generator may be operable to re-set the timing of the second repetitive signal relative to the second clock signal based on the first synchronisation signal so that the second repetitive signal is again set to have a phase relationship with the first repetitive signal which then meets the slave specification.

The second signal generator, or another signal generator of the clock-controlled circuitry, may be operable to monitor the phase relationship between the second repetitive signal and the first repetitive signal after the timing of the second repetitive signal relative to the second clock signal has been set and to determine if that phase relationship has changed such that it no longer meets the slave specification.

By (actively) monitoring the phase relationship, it is possible to detect when the phase relationship no longer meets the slave specification. The other signal generator may for example be the first signal generator or a central signal generator (such as a control unit) other than the first and second signal generators.

The second signal generator or the other signal generator may be operable to monitor the phase relationship between the second repetitive signal and the first repetitive signal by monitoring a phase relationship between the second repetitive signal and the first synchronisation signal.

The second signal generator or the other signal generator may be operable to monitor the phase relationship between the second repetitive signal and the first repetitive signal by monitoring a phase relationship between the second repetitive signal and a retimed first synchronisation signal being a retimed version of the first synchronisation signal.

The second signal generator or the other signal generator may be operable to monitor the phase relationship between the second repetitive signal and the first repetitive signal by obtaining a count value indicative of the phase relationship by: incrementing a counter between corresponding edges of the second repetitive signal and the first synchronisation signal or retimed first synchronisation signal; or incrementing a counter while the second repetitive signal and the first synchronisation signal or retimed first synchronisation signal have the same value as one another; or incrementing a counter while the second repetitive signal and the first synchronisation signal or retimed first synchronisation signal have different values from one another.

The first synchronisation signal may be part or all of the first repetitive signal, or may be derived from the first repetitive signal. For example, the first repetitive signal may comprise a plurality of component repetitive signals, and the first synchronisation signal may be one of those repetitive signals.

The second signal generator may be operable when operating in slave mode, to receive a release signal, and, if the release signal is received, to transition its operation to free-running mode. The second signal generator may be operable in connection with the transition to free-running mode, to continue generation of the second repetitive signal at its existing timing relative to the second clock signal without taking account of (i.e. without monitoring) the phase relationship between the second repetitive signal and the first repetitive signal.

The second signal generator may be operable, when operating in slave mode, to receive a re-synch signal indicating a change in the first repetitive signal, and, if the re-synch signal is received, to re-set the timing of the second repetitive signal relative to the second clock signal.

The re-synch signal may indicate a change in a repeating pattern of the first repetitive signal. In such a case, the second signal generator may be operable, if the re-synch signal is received, to re-set the timing of the second repetitive signal relative to the second clock signal based on the re-synch signal and re-configure the second repetitive signal based on the change in the repeating pattern indicated by the re-synch signal.

The second signal generator may be operable, when operating in slave mode, to monitor operation of the first signal generator, and, if the first signal generator is determined to become disabled (e.g. powered down or disconnected), to: transition its operation to master mode; and then continue generation of the second repetitive signal at its existing timing relative to the second clock signal without taking account of the phase relationship between the second repetitive signal and the first repetitive signal. The second signal generator may output a second synchronisation signal indicative of a phase of the second repetitive signal.

The first signal generator may be operable, when re-enabled after being disabled, to: monitor operation of the second signal generator and determine if the second clock control circuit is operating in master mode; and when it is determined that the second clock control circuit is operating in master mode, operate in slave mode.

The first signal generator may be operable, when operating in slave mode, to: set a timing of the first repetitive signal relative to the first clock signal based on the second synchronisation signal so that the first repetitive signal is set to have a phase relationship with the second repetitive signal which then meets the slave specification; and re-set the timing of the first repetitive signal relative to the first clock signal if it is determined that that phase relationship has changed such that it no longer meets the slave specification.

The first signal generator may be operable to re-set the timing of the first repetitive signal relative to the first clock signal based on the second synchronisation signal so that the first repetitive signal is again set to have a phase relationship with the second repetitive signal which then meets the slave specification.

The first signal generator, or another signal generator of the clock-controlled circuitry, may be operable to monitor the phase relationship between the first repetitive signal and the second repetitive signal after the timing of the first repetitive signal relative to the first clock signal has been set and to determine if that phase relationship has changed such that it no longer meets the slave specification.

The first signal generator or that other signal generator may be operable to monitor the phase relationship between the first repetitive signal and the second repetitive signal by monitoring a phase relationship between the first repetitive signal and the second synchronisation signal.

The first signal generator or that other signal generator may be operable to monitor the phase relationship between the first repetitive signal and the second repetitive signal by monitoring a phase relationship between the first repetitive signal and a retimed second synchronisation signal being a retimed version of the second synchronisation signal.

The first signal generator or that other signal generator may be operable to monitor the phase relationship between the first repetitive signal and the second repetitive signal by obtaining a count value indicative of the phase relationship by: incrementing a counter between corresponding edges of the first repetitive signal and the second synchronisation signal or retimed second synchronisation signal; or incrementing a counter while the first repetitive signal and the second synchronisation signal or retimed second synchronisation signal have the same value as one another; or incrementing a counter while the first repetitive signal and the second synchronisation signal or retimed second synchronisation signal have different values from one another.

The second synchronisation signal may be part or all of the second repetitive signal, or may be derived from the second repetitive signal.

The first signal generator and second signal generator may be operable to generate the first and second clock signals, respectively, based on the same global clock signal. The first and second signal generators may be operable to generate the first and second clock signals with differing degrees of accuracy.

The first repetitive signal may comprise a plurality of different component repetitive signals synchronised with the first clock signal, and/or the second repetitive signal may comprise a plurality of different component repetitive signals synchronised with the second clock signal.

The clock-controlled circuitry may be organised into at least first and second power domains, wherein the first power domain comprises the first clock domain and the second power domain comprises the second clock domain. Such different power domains may be powered on or off (powered up or down, or in normal or low-power mode) independently of one another or at different times from one another.

The first and second power domains may be provided on different IC chips, or they could be provided on the same IC chip. The clock-controlled circuitry may comprise first and second IC chips. The first IC chip may comprise the first power domain and the second IC chip may comprise the second power domain.

The clock-controlled circuitry may comprise a first data communication unit in the first clock domain and configured to operate based on the first clock signal, and a second data communication unit in the second clock domain and configured to operate based on the second clock signal. The first data communication unit may be operable to process a first data signal which is synchronous with the first clock signal, based on the first repetitive signal. The second data communication unit may be configured to process a second data signal which is synchronous with the second clock signal, based on the second repetitive signal. The first and second communication units may be configured to transfer such a data signal between them based on their respective first and second repetitive signals and via a retiming circuit so that the first data signal becomes the second data signal or vice versa.

The data signals may be audio data signals. The clock-controlled circuitry may be clock-controlled audio circuitry. The audio data signals may be organised into frames. The first and second data communication units may be configured to align the frames in their respective audio data signals with their respective repetitive signals.

The clock-controlled circuitry may comprise storage for storing information defining the slave specification. The first signal generator and/or the second signal generator may be configured to set the timing concerned based on the information. The determination that a said phase relationship has changed such that it no longer meets the slave specification may be made based on the information.

The information may comprise parameter values. The first signal generator and/or the second signal generator may be configured to set the timing concerned based on one or more of the parameter values. The determination that a said phase relationship has changed such that it no longer meets the slave specification may be made based on one or more of the parameter values.

The clock-controlled circuitry may comprise a controller operable to store the information in the storage so as to define the slave specification currently in use, optionally based on a user input.

According to a second aspect there is provided a method of controlling clock-controlled circuitry which is organised into at least first and second clock domains, the first clock domain configured to operate based on a first clock signal and the second clock domain configured to operate based on a second clock signal, wherein: the first clock domain comprises a first signal generator operable to generate a first repetitive signal synchronised to the first clock signal; the second clock domain comprises a second signal generator operable to generate a second repetitive signal synchronised to the second clock signal; and the first signal generator is operable, when operating in master mode, to output to the second signal generator a first synchronisation signal indicative of a phase of the first repetitive signal, the method comprising controlling the second signal generator, when operating in slave mode, to: set a timing of the second repetitive signal relative to the second clock signal based on the first synchronisation signal so that the second repetitive signal is set to have a phase relationship with the first repetitive signal which then meets a slave specification; and re-set the timing of the second repetitive signal relative to the second clock signal if it is determined that the phase relationship has changed such that it no longer meets the slave specification.

According to a third aspect there is provided a computer program which, when executed on a processor of clock-controlled circuitry, causes the clock-controlled circuitry to carry out a control method, wherein: the clock-controlled circuitry is organised into at least first and second clock domains; the first clock domain is configured to operate based on a first clock signal and the second clock domain is configured to operate based on a second clock signal; the first clock domain comprises a first signal generator operable to generate a first repetitive signal synchronised to the first clock signal; the second clock domain comprises a second signal generator operable to generate a second repetitive signal synchronised to the second clock signal; and the first signal generator is operable, when operating in master mode, to output to the second signal generator a first synchronisation signal indicative of a phase of the first repetitive signal, the method comprising controlling the second signal generator, when operating in slave mode, to: set a timing of the second repetitive signal relative to the second clock signal based on the first synchronisation signal so that the second repetitive signal is set to have a phase relationship with the first repetitive signal which then meets a slave specification; and re-set the timing of the second repetitive signal relative to the second clock signal if it is determined that the phase relationship has changed such that it no longer meets the slave specification.

According to a fourth aspect there is provided a computer-readable medium having the computer program of the aforementioned third aspect stored thereon.

As apparent from the above, method aspects corresponding to the apparatus (circuitry) aspects are envisaged. Features of the apparatus aspects may thus have corresponding features in the method aspects. Computer program and storage medium aspects are also envisaged as apparent from the above, and similar comments apply. The present disclosure will be understood accordingly.

BRIEF DESCRIPTION OF DRAWINGS

Reference will now be made, by way of example, to the accompanying drawings, of which:

FIG. 5 is a schematic diagram of a method which may be carried out by the clock-controlled circuitry of FIG. 1;

DETAILED DESCRIPTION OF EMBODIMENTS

Embodiments relate to clock-controlled circuitry and devices/apparatus comprising such circuitry. As will be apparent, such circuitry may find particular use as an IC SoC (System on Chip) in a host device. It will become apparent that circuitry disclosed herein is advantageous in that it enables data such as audio data to cross from one clock domain to another without significant associated power consumption, size/cost (e.g. IC chip area) impact, or delay/latency penalty.

Figure 1:
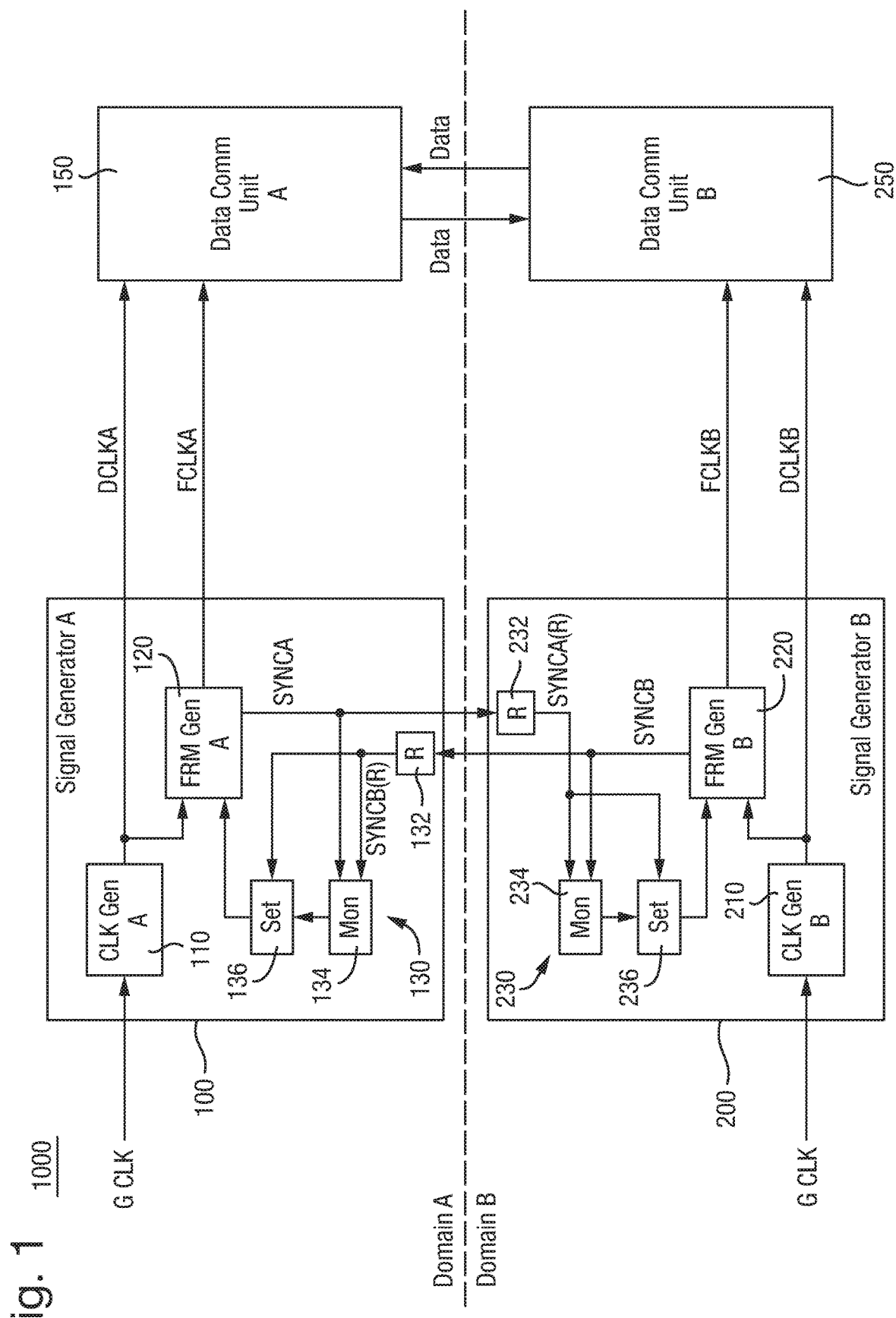
FIG. 1 is a schematic diagram of clock-controlled circuitry embodying the present invention.

FIG. 1 is a schematic diagram of clock-controlled circuitry 1000 embodying the present invention. As indicated, circuitry 1000 is organised into first and second clock domains, denoted Domain A and Domain B, respectively. Thus, various elements and signals in FIG. 1 are given the label "A" or "B" to indicate the clock domain which they are associated with. Those labels will however be omitted in the following description where possible for simplicity.

Domain A comprises a signal generator 100 and a data communication unit 150. Similarly, Domain B comprises a signal generator 200 and a data communication unit 250.

As depicted in FIG. 1, the signal generators 100 and 200 are both capable of acting in a "master" or "slave" mode. For example, the signal generator 100 may operate in master mode and the signal generator 200 may operate in slave mode, in which case the timing of certain signals generated by the signal generator 200 may be (at least at some point in time) related to or dependent on the timing of certain signals generated by the signal generator 100. Similarly, the signal generator 200 may operate in master mode and the signal generator 100 may operate in slave mode, in which case the timing of certain signals generated by the signal generator 100 may be (at least at some point in time) related to or dependent on the timing of certain signals generated by the signal generator 200.

It will later be explained however that in some arrangements it may be that one of the signal generators 100 and 200 is only capable of operating in master mode, in which case certain elements depicted in FIG. 1 need not be provided.

Signal generator 100 comprises a clock generator 110, a frame generator 120 and a relationship controller 130. The relationship controller 130 comprises a retiming unit 132, a monitoring unit 134 and a setting unit 136. Signal generator 200 comprises a clock generator 210, a frame generator 220 and a relationship controller 230. The relationship controller 230 comprises a retiming unit 232, a monitoring unit 234 and a setting unit 236.

The clock generators 110 and 210 operate generally in the same way as one another, in that they receive a common global clock signal GCLK and output respective domain clock signals DCLKA and DCLKB. The clock generators 110 and 210 may however differ from one another in some respects, for example in terms of their precision/accuracy. Thus, it may be that on average the frequencies of the domain clock signals DCLKA and DCLKB are the same as one another, or have some defined relationship to one another, but that over time the relationship fluctuates. Of course, this is just an example.

The frame generators 120 and 220 also operate generally in the same way as one another, based on their respective domain clock signals DCLKA and DCLKB. Indeed, it will be appreciated that various elements in the clock domains (e.g. in the signal generators 100 and 200) will be controlled by the relevant domain clock signal, or a clock signal derived therefrom, for synchronous operation, however such connections are not shown explicitly to avoid overcomplicating FIG. 1.

Figure 2:
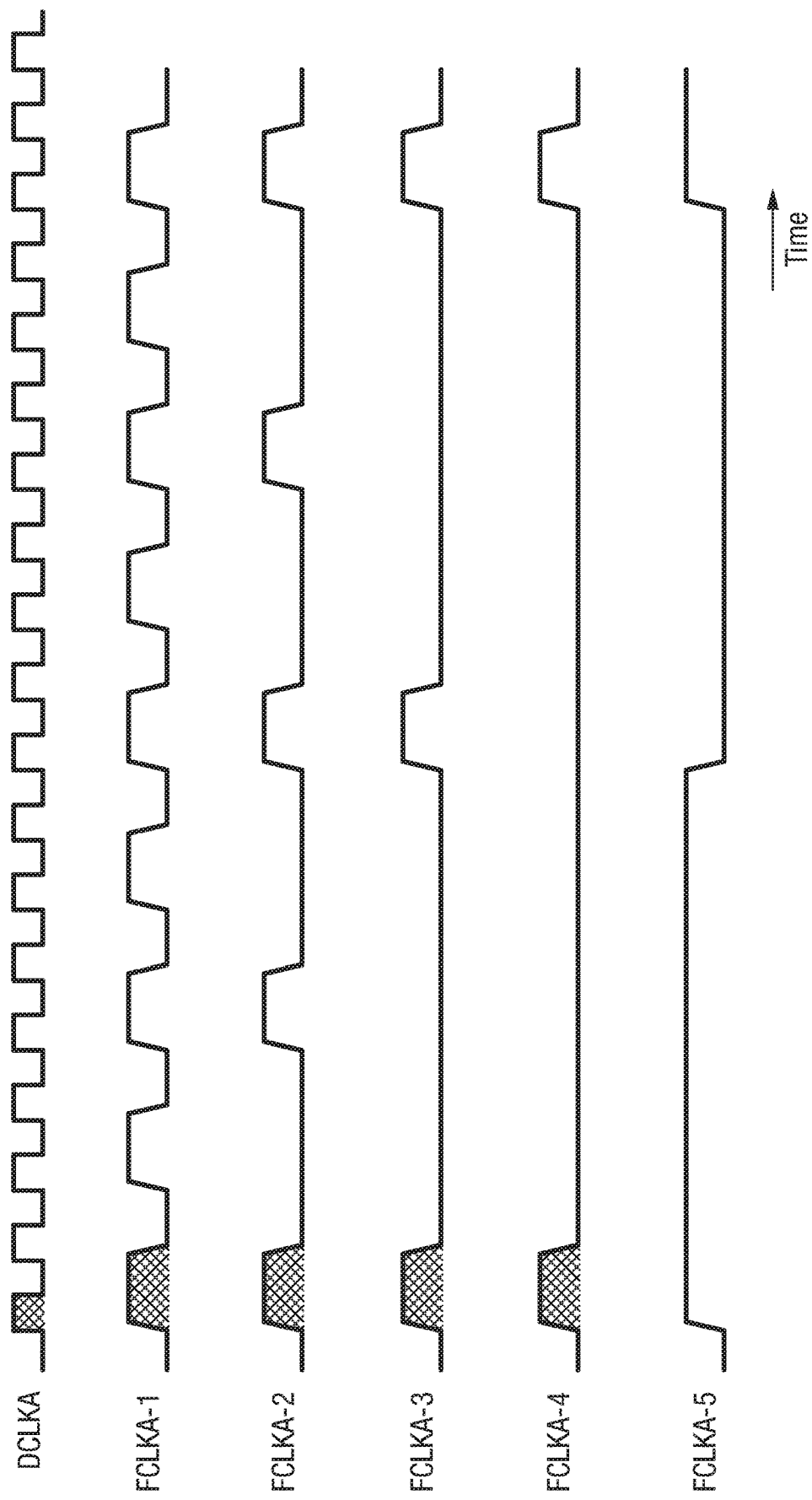
FIG. 2 is a schematic diagram indicating example frame clock signals.

Focussing on the frame generator 120 by way of example, FIG. 2 is a schematic diagram indicating example frame clock signals FCLKA which the frame generator 120 may output.

In FIG. 2, the domain clock signal DCLKA is presented at the top, followed by example frame clock signals FCLKA-1 to FCLKA-5. The frame generator 120 is configured to generate a repetitive signal which is synchronised to the domain clock signal DCLKA, and this repetitive signal could be considered to be FCLKA-1 to FCLKA-5 collectively or indeed any one or more of them. It will be understood that each of FCLKA-1 to FCLKA-5 is an example of a repetitive signal which is synchronised to the domain clock signal DCLKA, and that the number of them and indeed the particular repeating pattern exhibited by them may vary from arrangement to arrangement.

The signals FCLKA-1 to FCLKA-4 have the form of pulse signals, i.e. signals which comprise a regular series of pulses, with the pulse or sample rates differing from one to the next. Merely as examples, signals FCLKA-1 to FCLKA-4 may have 64 kHz, 32 kHz, 16 kHz and 8 kHz sample rates, respectively. In the context of audio data, these pulse signals may be considered strobe signals and may be used within their clock domain (i.e. by data communication unit 150) to facilitate routing or sample-rate converting of audio data while maintaining phase between channels.

The number of such strobe signals and their sample rates may for example be programmable or configurable, with the absolute periodicity and absolute time in generation dependent on the domain clock signal DCLKA.

The signal FCLKA-5 has the form of a toggle signal, and in this example toggles between high and low in line with the pulses of signal FCLKA-3. The repetitive signals may thus have the form of pulse signals or toggle signals, or indeed may exhibit any other repetitive pattern.

It will be assumed for convenience of explanation that DCLKB corresponds to DCLKA in that they both have the same nominal (average) frequency, both being generated from the global clock signal GCLK, and that the frame generator 220 generates frame clock signals FCLKB-1 to FCLKB-5 based on DCLKB which are nominally the same as FCLKA-1 to FCLKA-5, respectively. In other arrangements there may be more significant differences between DCLKA and DCLKB, and between the signal(s) which make up FCLKA and FCLKB.

In order to consider how the signal generators 100 and 200 may affect one another, it will be assumed for now that the signal generator 100 operates in master mode and that the signal generator 200 operates in slave mode.

The frame generator 120 outputs a synchronisation signal SYNCA to the signal generator 200. It will be assumed that the signal SYNCA is the same as the signal FCLKA-5, although it could be any other signal (such as another FCLKA signal in FIG. 2) which is indicative of a phase of the Domain A frame clock signals FCLKA. The synchronisation signal SYNCA is indicative of a phase of the other frame clock signals FCLKA-1 to FCLKA-4, since it is synchronised with them (all are synchronised with DCLKA). The signals SYNCA and FCLKA-3 are shown as the upper two signals in the signal diagram of FIG. 3. Each of the signal traces shown in FIG. 3 may be considered to show the change in voltage level of the signal concerned over time.

Figure 4:
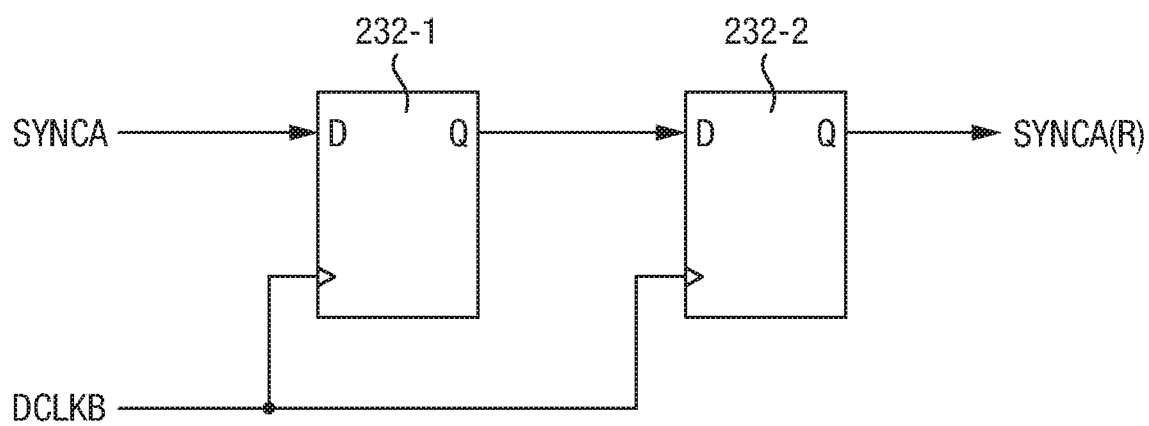
FIG. 4 is a schematic diagram of an example implementation of a retiming unit of FIG. 1.

The synchronisation signal SYNCA is received by the retiming unit 232 and retimed to be synchronous to the domain clock signal DCLKB to produce the retimed equivalent signal SYNCA(R). FIG. 4 is a schematic diagram of merely one simple example implementation of the retiming unit 232, in which it comprises a plurality of flip-flops 232-1 and 232-2 connected together in a chain as indicated, and clocked by the domain clock signal DCLKB (i.e. a clock signal of the receiving clock domain, Domain B). The synchronisation signal SYNCA is received at the D input of the first flip-flop 232-1, the Q output of that flip-flop 232-1 is connected to the D input of the second flip-flop 232-2, and the retimed synchronisation signal SYNCA(R) is output from the Q output of the second flip-flop 232-2 synchronously with the domain clock signal DCLKB. This synchroniser structure is useful for avoiding metastability problems which may arise were only one flip-flop to be used.

Returning to FIG. 1, the monitoring unit 234 is connected to receive the retimed signal SYNCA(R) and to control the setting unit 236 (which may also receive the retimed signal SYNCA(R) as shown) to initialise operation of the frame generator 220 based on the retimed signal SYNCA(R). In particular, the frame generator 220 is controlled to output its frame clock signal FCLKB (which is considered in this example to be composed of component frame clock signals FCLKB-1 to FCLKB-5) with a timing linked to the domain clock signal DCLKB such that the frame clock signal FCLKB is set at that time to have a phase relationship with the frame clock signal FCLKA (here, comprising component frame clock signals FCLKA-1 to FCLKA-5) which meets a slave specification. The slave specification may comprise one or more parameters, which may be configurable or programmable, and which define the desired phase relationship.

In more detail, looking at FIG. 2, the frame generator 120 is controlled to output its frame clock signal FCLKA with a timing linked to the domain clock signal DCLKA as indicated by the highlighted pulses of the signals DCLKA and FCLKA. That is, the first pulses (highlighted) of the frame clock signals FCLKA-1 to FCLKA-4 and the first rising edge of the toggle signal FCLKA-5 are aligned with (linked to, or triggered by) the highlighted pulse of the signal DCLKA. The frame generator 120 is configured to continue generating the frame clock signal FCLKA with that timing relative to the domain clock signal DCLKA, e.g. by way of a counter triggered by the domain clock signal DCLKA, unless it is reset or its operation is adjusted in some way. The monitoring unit 234 and the setting unit 236 then control the frame generator 220 to link the frame clock signal FCLKB to the domain clock signal DCLKB in a similar way, but such that at that time a phase relationship (an initial phase relationship) between the frame clock signals FCLKA and FCLKB meets the slave specification. The frame generator 220 may then continue to produce the frame clock signals FCLKB to have the relevant repeating pulse/toggle pattern using, for example, a counter triggered by the domain clock signal DCLKB.

Figure 3:
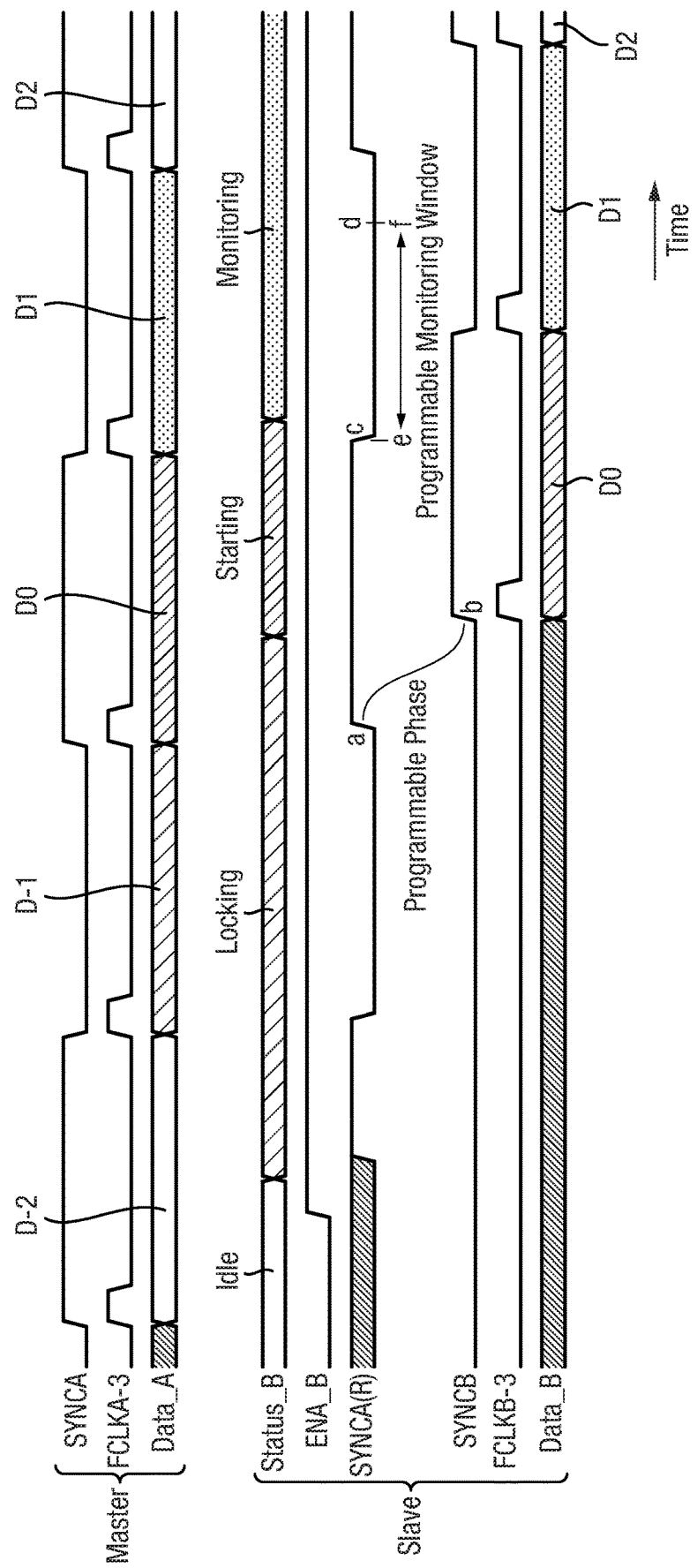
FIG. 3 is a signal diagram useful for understanding operation of the FIG. 1 circuitry.

This setting of the phase relationship between the frame clock signals FCLKA and FCLKB can be appreciated by further consideration of FIG. 3. The frame generator 220 outputs a synchronisation signal SYNCB, which is assumed here to be the same as the signal FLCKB-5 for consistency with the corresponding synchronisation signal SYNCA. The synchronisation signal SYNCB is indicative of a phase of the other frame clock signals FCLKB-1 to FCLKB-4, since it is synchronised with them (all are synchronised with DCLKB). The signals SYNCB and FCLKB-3 are shown in FIG. 3.

As indicated in FIG. 3, once the retimed signal SYNCA (R) has been established, e.g. after the retiming unit 232 has been enabled and its operation has stabilised, the frame generator 220 is controlled, based on the retimed signal SYNCA(R), to output the signals SYNCB and FCLKB-3 (amongst others) so that there is a phase difference between corresponding edges of SYNCA(R) and SYNCB which meets the slave specification. This is indicated as being a "programmable phase" in FIG. 3 as an example, since this initial phase relationship may be configured by way of a parameter—such as a delay between signal edges—defined in the slave specification.

Because the signal SYNCA(R) is a retimed version of the signal SYNCA, by setting an initial phase relationship between SYNCA(R) and SYNCB effectively an initial phase relationship is also set between SYNCA and SYNCB, and thus also between FCLKA and FCLKB. For example, as can be appreciated from FIG. 3, an initial phase relationship is set between FCLKA-3 and FCLKB-3. It will become apparent that it is the relationship between signals FCLKA and FCLKB which affects how data is handled.

The monitoring unit 234 is connected to receive the signals SYNCA(R) and SYNCB as indicated in FIG. 1. Based on these signals, and after the timing of the frame clock signal FCLKB has been set relative to the domain clock signal DCLKB as mentioned above, the monitoring unit 234 is configured to monitor the phase relationship between the signals SYNCB and SYNCA(R) (indicative of the relationship between SYNCB and SYNCA) to determine if that phase relationship has changed such that it no longer meets the slave specification.

This could for example involve detecting whether an edge of the signal SYNCB is within a monitoring window of defined duration and positioned in time relative to the signal SYNCA(R). Such a window is indicated as being a "programmable monitoring window" in FIG. 3 as an example, since the window may be configured again by way of a parameter—such as a range of acceptable delays between signal edges—defined in the slave specification. The programmable monitoring window in FIG. 3 is defined as beginning at a falling edge of the signal SYNCA(R) and having a defined duration.

Looking at FIG. 3, the status of the signal generator 200 is indicated by the signal STATUS_B (not shown in FIG. 2). Firstly, the signal generator 200 is in an "idle" state until it is enabled by the rising edge of an enable signal ENA_B (also not shown in FIG. 2). The status then becomes "locking" as the signal SYNCA(R) becomes established and the frame clock signal FCLKB is generated with the desired phase relationship set as mentioned above, and "starting" as data transfer across the domain boundary begins (as discussed in more detail below). The status then becomes "monitoring" as the phase relationship between the signals SYNCB and SYNCA(R) is monitored.

In the example in FIG. 3, if the corresponding falling edge of the signal SYNCB falls within the programmable monitoring window as shown (the edge is depicted in FIG. 3 falling approximately in the middle of the window), then it is determined that the phase relationship continues to meet the slave specification. In that case, the frame generator 220 is allowed to continue generating the frame clock signal FCLKB at its current timing relative to the domain clock signal DCLKB.

If, however, the corresponding falling edge of the signal SYNCB no longer falls within the programmable monitoring window then it is determined that the phase relationship no longer meets the slave specification. This could occur, for example, due to a temporary glitch or failure in e.g. any of the clock generators 110 and 210 and the frame generators 120 and 220 or due to a cosmic event (e.g. an ionizing particle strike). In that case, the monitoring unit 234 and setting unit 236 act to re-set the timing of the frame clock signal FCLKB relative to the domain clock signal DCLKB (e.g. by reinitialising the frame generator 220, or by adjusting its operation) such that the frame clock signal FCLKB is again set at that time to have a phase relationship with the frame clock signal FCLKA which meets the slave specification.

In this way, the desired phase relationship between the frame clock signal FCLKB and the frame clock signal FCLKA can quickly (e.g. immediately) be re-established. Of course, if the phase relationship is continually monitored (e.g. every falling edge of SYNCB is checked, in the context of the FIG. 3 example), then the desired phase relationship between the frame clock signal FCLKB and the frame clock signal FCLKA may be re-established if necessary very quickly. However, in some arrangements it may be acceptable to monitor the phase relationship intermittently, e.g. from time to time, such that the desired phase relationship may be re-established less quickly.

Looking again at FIG. 3, when the desired phase relationship between the frame clock signal FCLKB and the frame clock signal FCLKA is established, a data signal DATA_A handled by the data communication unit 150 in Domain A can be transferred to the data communication unit 250 in Domain B as data signal DATA_B, with the frames (D0, D1, D2) of the data signal DATA_A being aligned with (controlled by) the signal FCLKA-3 and the corresponding (received) frames (D0, D1, D2) of the data signal DATA_B being aligned with (controlled by) the signal FCLKB-3. In this respect, it can be seen that the frame clock signals FCLKA and FCLKB may be used by the data communication units 150 and 250 to handle data signals, and in particular their alignment or phase relative to one another.

For example, in some audio applications latency may be of particular importance. For example, there may be relatively strict requirements to move e.g. PCM audio data from one system location to another in the minimal clock or frame cycles possible. This may be to help ensure that there are no notable lags for mobile telephony, contextual awareness or audio/sensor fusion. From FIG. 3 it can be seen that the latency between the frame D0 in DATA_A and D0 in DATA_B is less than a single frame length, which constitutes relatively low latency.

As another example, in some audio applications the number of clock cycles per data frame may need to be consistent. In some synchronisation schemes it is acceptable for the frame size to be jittery in the destination clock domain but this may be undesirable or even unacceptable in audio applications in which there are audio converters or audio interfaces that require an exact number of system clocks (domain clock signal cycles) per data frame to ensure a correct audio signal transfer function or correct interfacing with other audio interfaces. The re-establishment of the phase relationship as described above may help ensure such consistency in clock cycles per data frame.

It is thus clear that if the phase relationship were not re-established in the event of a temporary glitch or failure as above, data (e.g. audio samples) could be dropped or repeated as data is transferred to/from either domain and/or other disadvantages as explained above may ensue.

The data communication units 150 and 250 may comprise processing, routing and/or conversion (e.g. digital-to-analogue, or vice versa) circuitry. The data communication units 150 and 250 may also be considered to encompass input and/or output transducers, which in the context of audio data may include inter alia microphones and speakers.

With the ability to quickly detect a phase relationship outside, or not meeting, the slave specification and re-establish the phase relationship in line with the slave specification as mentioned above, the data signal DATA_B may only suffer loss of one or just a few such frames as compared to the data signal DATA_A as the phase relationship is re-established, which in the context of audio data may be imperceptible to the end-user (e.g. listening to the audio via a speaker).

Another advantage of the present technique is that there is no need for a deep (large) FIFO buffer or similar between the two clock domains to buffer the data signal DATA_A as it crosses the domain boundary to become data signal DATA_B. As mentioned above, the initial phase difference between the signals SYNCA(R) and SYNCB (i.e. effectively between FCLKA and FCLKB), indicated in FIG. 3 as a "programmable phase", may be configured so that simple sampling of the data signal DATA_A as it crosses the clock domain boundary to become data signal DATA_B will be sufficient. For example, retiming circuitry (not shown) such as that described in relation to retiming units 132 and 232 (see the example in FIG. 4) may be used.

Also as mentioned above, the size of the monitoring window, indicated in FIG. 3 as a "programmable monitoring window", may be configured by way of the slave specification so that an expected range of fluctuation in the phase relationship may be tolerated, within the operational capability of the retiming/synchronising circuitry used to convert the data signal DATA_A to the data signal DATA_B as it crosses the clock domain boundary. The size of the monitoring window and the initial phase difference may be parameters defined in the slave specification.

It will be appreciated that in FIG. 3 it is assumed that the direction of data transfer is from Domain A to Domain B, i.e. from data communication unit 150 to data communication unit 250, so that data signal DATA_A becomes data signal DATA_B. In this case, the initial phase difference may be set as in FIG. 3 such that the signal SYNCA(R) leads SYNCB (i.e. effectively FCLKA leads FCLKB), allowing the data retiming/synchronising/sampling time to occur. Of course, in another arrangement (not shown in FIG. 3) it may be that the direction of data transfer is from Domain B to Domain A, i.e. from data communication unit 250 to data communication unit 150, so that data signal DATA_B becomes data signal DATA_A. In this case, the initial phase difference may be set such that the signal SYNCA(R) lags SYNCB (i.e. effectively FCLKA lags FCLKB), again so that the data retiming/synchronising/sampling has time to occur. Such a situation may occur if there is already a data signal being handled in Domain A when a situation occurs where it is necessary to transfer another data signal from Domain B to Domain A.

The situation may also occur that it is necessary to simultaneously transfer one data signal from Domain A to Domain B, and another data signal from Domain B to Domain A. In that case it may be that multiple pairs of frame generators such as frame generators 120 and 220 are employed. As another example, where the signal generator 100 is operating in master mode and the signal generator 200 is operating in slave mode as described so far, it may be that the component frame clock signals making up frame clock signal FCLKB are organised so that, when the initial phase difference is set such that the signal SYNCA(R) leads SYNCB (i.e. effectively FCLKA leads FCLKB) as in FIG. 3, there is at least one component frame clock signal of FCLKB which is staggered relative to the others so that it appears to lead FCLKA.

Incidentally, although only one frame clock signal FCLKA-3 (and corresponding frame clock signal FCLKB-3) is shown in FIG. 3, there may in fact be a plurality of frame clock signals used in each of the clock domains running at different sample/pulse rates (see e.g. FIG. 2) with corresponding different data signals (e.g. audio data signals) running at those rates.

Where the signal generator 100 is operating in master mode and the signal generator 200 is operating in slave mode as described so far, it may be that the sample rate adopted in Domain A is changed on-the-fly, i.e. while the signal generator 200 has the "monitoring" status as in FIG. 3 with the frame clock signals FCLKA and FCLKB already running with a phase relationship which meets the slave specification. Such a change in sample rate may change the frame clock signal FCLKA so that it is necessary to re-establish the phase relationship between the frame clock signals FCLKA and FCLKB, and potentially also change the format (e.g. sample rate) of the frame clock signal FCLKB. In this case, the signal generator 100 may be configured to send a re-synch signal (not shown) to the signal generator 200 to cause the phase relationship between the frame clock signals FCLKA and FCLKB to be re-established as mentioned above, and potentially to also cause the format (e.g. sample rate) of the frame clock signal FCLKB to be changed accordingly.

As another example, where the signal generator 100 is operating in master mode and the signal generator 200 is operating in slave mode, with the frame clock signals FCLKA and FCLKB already running with a phase relationship which meets the slave specification, it may be that it is no longer necessary for the frame clock signal FCLKB to be slaved (in the sense of continued monitoring) to the frame clock signal FCLKA. This may be indicated for example by a release signal (not shown) received in the signal generator 200 from the signal generator 100 or indeed from a separate control unit (not shown). In such a case, the signal generator 200 may be configured to cease the monitoring of the phase relationship and to allow the frame generator 220 to continue to generate the frame clock signal FCLKB with its current timing relative to the domain clock signal DCLKB. In this respect, the signal generator 200 may be considered to have transitioned from slave mode to master mode or another free-running mode.

The signal generator 200 may also transition from slave mode to master mode if the signal generator 100 ceases operation for some reason, for example if it is disabled. The signal generator 200 may for example monitor an enable signal (not shown) for the signal generator 100 to determine that is has been disabled, or may for example determine that the signal generator 100 has been disabled if it no longer receives a signal from the signal generator 100 such as the synchronisation signal SYNCA. In such a case, the signal generator 200 may again be configured to cease the monitoring of the phase relationship and to allow the frame generator 220 to continue to generate the frame clock signal FCLKB with its current timing relative to the domain clock signal DCLKB. In this respect, the signal generator 200 may again be considered to have transitioned from slave mode to master mode.

So far, the case where the signal generator 100 is operating in master mode and the signal generator 200 is operating in slave mode has been considered, along with situations where the signal generator 200 may transition from slave mode to master mode. In these cases, it has not been necessary to consider the relationship controller 130, which comprises the retiming unit 132, monitoring unit 134 and setting unit 136. As such, if only such cases are needed the relationship controller 130 need not be provided.

However, it will be appreciated from the above, that there may arise the case where the signal generator 200 is operating in master mode (e.g. because the signal generator 100 has been disabled) and the signal generator 100 is then enabled (e.g. re-enabled).

One possibility is of course that the signal generator 100 starts up in master mode again, and that the signal generator 200 is returned to slave mode, with the phase relationship re-established by way of the relationship controller 230 as described above. However, this may be disadvantageous if a data signal is already being handled by the signal generator 200 with it operating in master mode, since the retiming of the FCLKB signal(s) relative to the domain clock signal DCLKB may cause a glitch or other disruption in that data signal.

Another possibility is thus for the signal generator 100, which had previously been in master mode before it was disabled (or which had not yet been enabled), to be started up in slave mode. In that case, the relationship controller 130 may be employed analogously to how the relationship controller 230 is employed when the signal generator 200 is in slave mode as described above. This may be understood from FIG. 3, but with the signals denoted with "A" swapped for the equivalent signals denoted with "B", and vice versa. The above description relating to the signal generator 100 operating in master mode and the signal generator 200 operating in slave mode, including the related transfer of data between the two domains, thus applies here mutatis mutandis but with the signal generator 200 operating in master mode and the signal generator 100 operating in slave mode.

For example, once the retimed signal SYNCB(R) has been established, e.g. after the retiming unit 132 has been enabled and its operation has stabilised, the frame generator 120 may be controlled, based on the retimed signal SYNCB(R), to output the signals SYNCA and FCLKA-3 (amongst others) so that there is a phase difference between corresponding edges of SYNCB(R) and SYNCA which meets the or another slave specification. As in FIG. 1, the monitoring unit 134 is connected to receive the signals SYNCA(R) and SYNCB. Based on these signals, and after the timing of the frame clock signal FCLKA has been set relative to the domain clock signal DCLKA, the monitoring unit 134 may be configured to monitor the phase relationship between the signals SYNCA and SYNCB(R) (indicative of a relationship between SYNCB and SYNCA) to determine if that phase relationship has changed such that it no longer meets the slave specification concerned. If it is determined that the phase relationship no longer meets the slave specification, the monitoring unit 134 and setting unit 136 may then act to re-set the timing of the frame clock signal FCLKA relative to the domain clock signal DCLKA (e.g. by reinitialising the frame generator 120, or by adjusting its operation) such that the frame clock signal FCLKA is again set at that time to have a phase relationship with the frame clock signal FCLKB which meets the slave specification.

To allow this operation, the relationship controller 130 accordingly needs to be provided. In that case, the signal generators 100 and 200 may be considered to have the same general structure and function as one another.

Looking at the relationship controller 230, as a representative one of the relationship controllers 130 and 230, it will be appreciated that there are a number of ways in which to monitor the master-slave synchronicity, i.e. the phase relationship between the signals SYNCB and SYNCA(R) (effectively between SYNCB and SYNCA, or FCLKB and FCLKA).

For example, if the signals SYNCB and SYNCA(R) are toggle signals as in FIG. 3, a counter (e.g. in the monitoring unit 234) can be started when SYNCB and SYNCA(R) are not equal and stopped when they are. If the count falls outside a programmable or configurable value range (whose size represents the size of the monitoring window) it can be determined that the monitoring window has been exceeded (in either direction)—i.e. the phase relationship no longer meets the slave specification. For example, the range may be represented by a single value, and a count value larger than that value (or corresponding to a negative value) may indicate that the monitoring window has been exceeded.

In another example, if the signals SYNCB and SYNCA(R) signals are pulse signals, for example being FCLKB-3 and FCLKA-3(R), where FCLKA-3(R) is a retimed version of FCLKA-3, a counter (e.g. in the monitoring unit 234) can be started on an edge-detection of FCLKA-3(R) and incremented until the corresponding FCLKB-3 edge is detected. Again if the count falls outside a programmable or configurable value range (whose size represents the size of the monitoring window) it can be determined that the monitoring window has been exceeded (in either direction)—i.e. the phase relationship no longer meets the slave specification.

As above, if the monitoring unit 234 determines that the phase relationship no longer meets the slave specification, then the setting unit 236 (which may be a finite state machine) is controlled to cause the frame generator 220 to re-establish the desired phase relationship. This can effectively occur by causing the frame generator 220 to generate the next SYNCB signal (and the related FCLKB signals) with the given phase relationship ("programmable phase", in FIG. 3) after the next appropriate edge of the SYNCA(R) signal, i.e. after the equivalent delay has elapsed.

In these examples, knowing which of the signals SYNCB and SYNCA(R) leads or lags relative to the other allows the associated hardware of the monitoring unit 234 to be minimised, especially if using a counter, as it does not then need to count up an entire frame of clock cycles.

Incidentally, in FIG. 1 it has been assumed that the phase-relationship monitoring is carried out in the one of the signal generators 100 and 200 which is in slave mode. However, it would be possible for that monitoring to be carried out outside that signal generator, for example in the one of the signal generators 100 and 200 which is in master mode. For example, looking at FIG. 3, when the signal generator 200 is in slave mode the monitoring could be carried out by the monitoring unit 134 using signals SYNCA and SYNCB(R), with the monitoring unit 134 then controlling the setting unit 236 or the frame generator 220 directly. Equally, in some arrangements the functionality of the monitoring and setting units could be provided outside the signal generators (e.g. in a common control unit).

FIG. 5 is a schematic diagram of a method 300 which may be carried out by the clock-controlled circuitry 1000, for example by one of the signal generators 100 and 200. For consistency with FIG. 3, method 300 as depicted in FIG. 5 has been tailored specifically for operation by the signal generator 200 however it could equally be tailored for operation by the signal generator 100 by replacing references to Domain A and its elements with references to Domain B and its elements, and vice versa.

Method 300 comprises steps S2 to S22.

In step S2, it is determined whether Domain A (i.e. signal generator 100) is already enabled and in master mode, for example such that it is already generating frame clock signal FCLKA. This determination may be carried out by the signal generator 200 itself, for example based on a signal received from the signal generator 100. In such a case, the data communication unit 150 may already be handling a data signal based on frame clock signal FCLKA.

If signal generator 100 is already enabled and in master mode (S2, YES), the method proceeds to step S4. Otherwise (S2, NO), the method proceeds to step S22.

In step S4, the signal generator 200 determines that it should operate in slave mode and the method proceeds to step S6, in which the signal generator 200 establishes the retimed synchronisation signal SYNCA(R) based on SYNCA received from the signal generator 100.

The method then proceeds to step S8, in which the timing of the frame clock signal FCLKB is set relative to the domain clock signal DCLKB so that there is an initial phase relationship (defined by a slave specification) between the signals SYNCA(R) and SYNCB which translates to an acceptable initial phase relationship between the signals FCLKB and FCLKA.

The method then proceeds to step S10 in which the ongoing phase relationship is monitored. If the phase relationship continues to meet the slave specification (S12, YES), the method proceeds to step S14. Otherwise (S12, NO), the method returns to step S8 where the timing of the frame clock signal FCLKB is re-set relative to the domain clock signal DCLKB so that there is again an intended initial phase relationship (defined by a slave specification) between the signals SYNCA(R) and SYNCB.

In step S14, it is determined whether a re-synch signal has been received by the signal generator 200, for example from the signal generator 100. If a re-synch signal has been received (S14, YES), the method proceeds back to step S8, optionally via step S20 if it is necessary to adjust the sample rate or some other parameter of signal FCLKB based on the re-synch signal. If a re-synch signal has not been received (S14, NO), the method proceeds to step S16.

In step S16, it is determined whether a release signal has been received by the signal generator 200, for example from the signal generator 100. If it has (S14, YES), the method proceeds to step S22. If it has not (S16, NO), the method proceeds to step S18.

In step S18, it is determined whether Domain A (in particular, signal generator 100) has been disabled, for example based on a signal received (or no longer received) from the signal generator 100. If it has (S14, YES), the method proceeds to step S22. If it has not (S16, NO), the method returns to step S10.

In step S22 it is determined that the signal generator 200 of Domain B may operate in master mode, or in a similar free-running mode. In that case, the timing of the frame clock signal FCLKB is set (or is left set) relative to the domain clock signal DCLKB but without needing to consider (or monitor) any phase relationship between FCLKB and any signal from Domain A. The frame clock signal FCLKB may then continue to run with that timing relative to the domain clock signal DCLKB.

Although not shown in FIG. 5, at any time the signal generator 200 may be disabled in which case the method 300 may terminate. It will be appreciated that the ordering of certain steps in method 300 is just an example. For example, steps S14 and S16 may occur between steps S8 and S10.

Of course, although only two clock domains are shown in FIG. 1, there may be more than two clock domains with for example signal generator 100 operating in master mode and two or more signal generators (equivalent to signal generator 200 but in different clock domains) operating in slave mode in a master-slave relationship with signal generator 100. The present disclosure will be understood accordingly.

The different clock domains may be or be part of different power domains, so that the different domains may be powered on or off independently. For example, in the case of implementation in a host device such as a mobile telephone, it may be desirable to have one power domain operating as an "always on" domain which can react quickly to an external stimulus (such an audio signal picked up by a microphone), and another (e.g. central) power domain which is powered down unless it is "woken up" by the always on domain (perhaps via a higher-level application processor or the like). As another consideration, the different clock and/or power domains may be provided on the same IC chip or on different chips which are connected to one another.

It will be understood that, provided that the two (or more) clock generators share the same root, master or global clock signal (see GCLK in FIG. 1) then, under programmatic control, one (or more) frame generator(s) can be slaved to the other frame generator such that their phase is guaranteed or controlled within the bounds of clock-domain-crossing and clock-jitter error. The global clock signal GCLK in FIG. 1 may be used directly by the clock generators 110 and 210, or may be provided to them via a clock synthesis circuit such as a PLL (Phase Lock Loop).

By way of summary, in a possible arrangement the start-up of the slaved frame generator(s) is controlled to manage the phase relationship between itself and the master frame generator using a retimed version of a strobe or frame clock signal provided from the master frame generator as a synchronisation signal. Once started, the phase relationship is monitored e.g. in the slaved frame generator(s) to determine whether it moves unexpectedly, i.e. such that the slave specification is no longer met. If it does then the relevant slaved frame generator(s) is resynchronized automatically—re-establishing the master-slave phase relationship. If the master frame generator's sample rate is changed on-the-fly then the slave frame generator is again resynchronized automatically (e.g. on receipt of a re-synch signal). If the master frame generator is disabled the running slave frame generator may automatically become a master frame generator—i.e. no longer monitoring the master-slave phase relationship. If the original frame generator (which had been the master slave generator) is restarted it may by default be slaved to the new master frame generator. This has the benefit of avoiding unnecessary dropped or repeated samples on running data (e.g. audio) channels. At any time, a slaved frame generator may be set to free-run mode (e.g. on receipt of a release signal), i.e. no longer monitoring the master-slave phase relationship. This is akin to being set to master mode.

Figure 6:
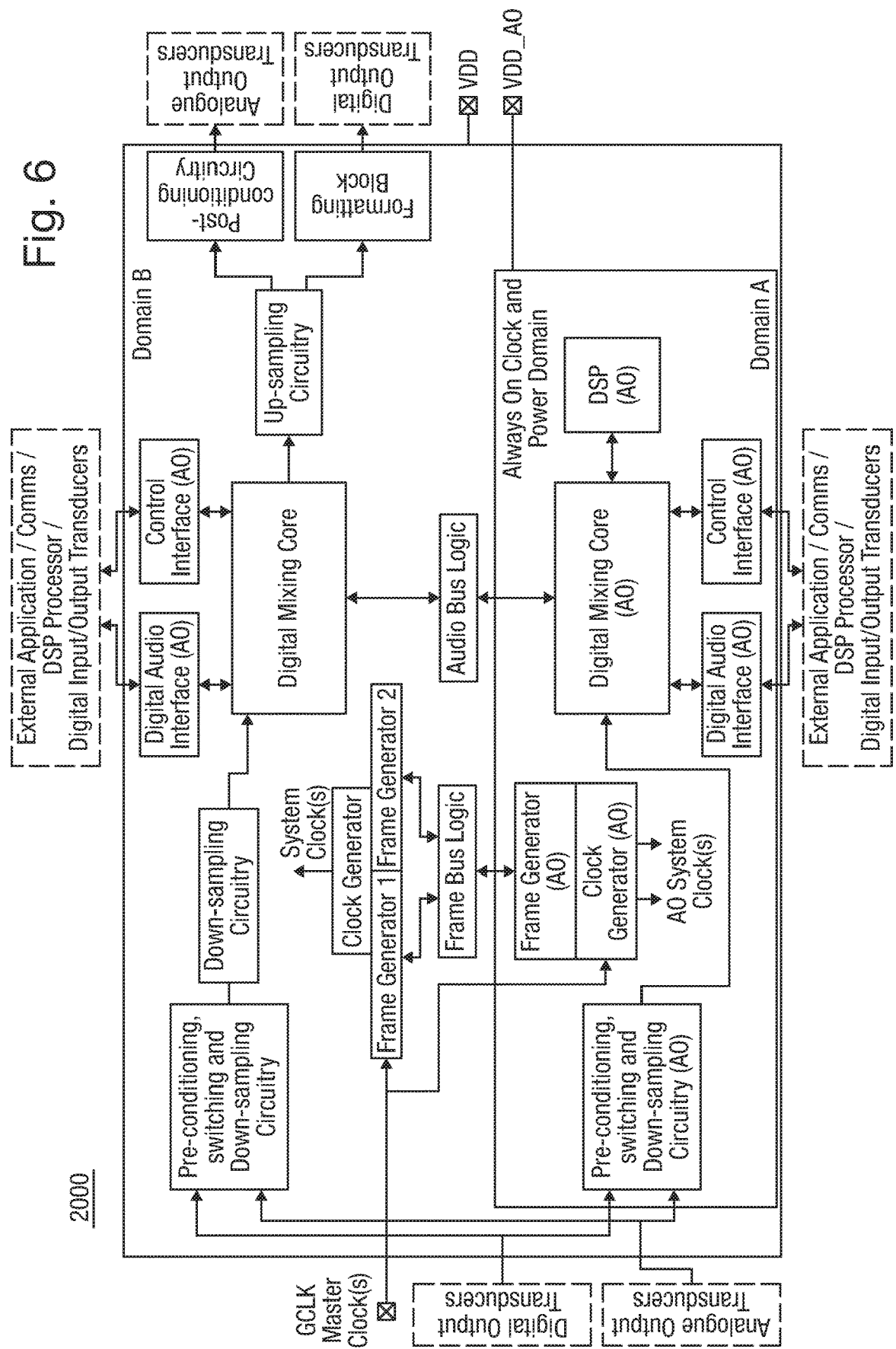
FIG. 6 is a schematic diagram of an example detailed implementation of clock-controlled circuitry which corresponds to the FIG. 1 clock-controlled circuitry.

FIG. 6 is a schematic diagram of an example detailed implementation of clock-controlled circuitry 2000 which corresponds to clock-controlled circuitry 1000, useful for better understanding a possible application of the circuitry disclosed herein.

Clock-controlled circuitry 2000 has the form of a SoC, i.e. and IC chip configured for audio processing. The circuitry 2000 is divided into an "always on" (AO) clock and power domain, labelled Domain A for comparison with FIG. 1, and a central clock and power domain, labelled Domain B again for comparison with FIG. 1. External connections to input and/or output transducers are shown, along with power (VDD) connections, for both domains.

Both domains are shown having clock and frame generators, corresponding to those in FIG. 1. The digital mixing core and DSP in the AO domain (along with the other circuitry in the data path(s) between transducers and e.g. the other domain and/or the external connection to an external application/comms/DSP processor) may thus correspond to the data communication unit 150 in FIG. 1, and the digital mixing core in the central domain (along with the other circuitry in the data path between transducers and e.g. the other domain and/or the external connection to an external application/comms/DSP processor) may thus correspond to the data communication unit 250 in FIG. 1.

In this regard, the frame generator in the AO domain (Domain A) may generate frame clock signals equivalent to FCLKA in FIG. 1, and one or both of the frame generators in the central domain (Domain B) may generate frame clock signals equivalent to FCLKB in FIG. 1, for use by the data communication units concerned.

Thus, one typical scenario may be that an audio data stream is first received from the relevant input transducer by the data communication unit circuitry in the AO domain (Domain A) with the frame generator in that domain thus operating in master mode. At that time, the central domain may be powered down, or in a low-power mode. The data may for example be routed to an external application processor via the external connection to the AO domain, which subsequently "wakes up" the central domain, i.e. transitions it into a powered-up or operational mode. Once powered up, one or both of the frame generators in the central domain (Domain B) may be slaved to the frame generator in the AO domain (Domain A), so that an audio data stream may be passed from the digital mixing core of the AO domain to that of the central domain without causing glitches or suffering significant latency. It will be appreciated that the functionality disclosed herein may help enable low latency transfer of such audio between domains, with reduced risk of audio artefacts or similar.

It will already be understood that clock-controlled circuitry considered herein may be implemented in a host device, for example an electrical or electronic device. Examples include a portable and/or battery powered host device such as a mobile telephone, an audio player, a video player, a PDA, a mobile computing platform such as a laptop computer or tablet and/or a games device, for example.

Figure 7:
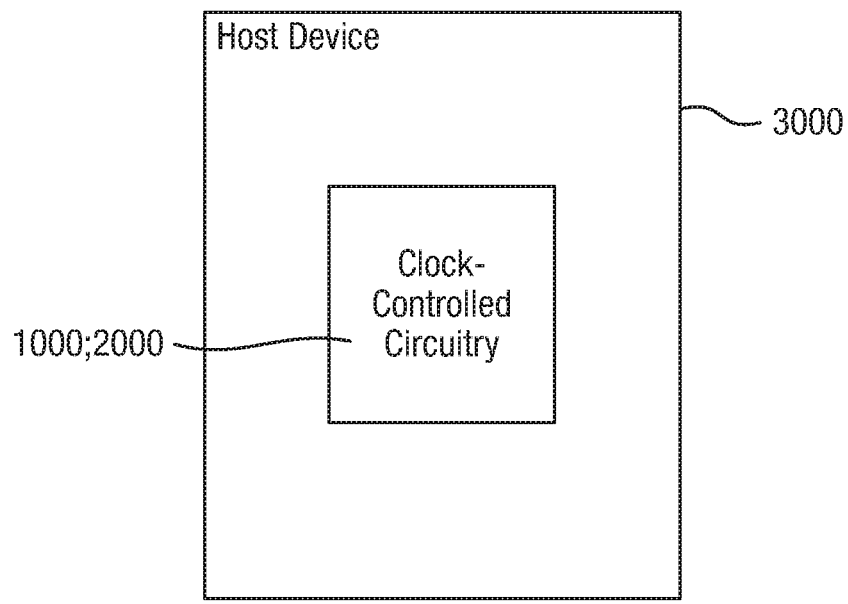
FIG. 7 is a schematic diagram of an electrical or electronic device in which the clock-controlled circuitry of FIG. 1 or 6 may be deployed.

FIG. 7 is a schematic diagram of an electrical or electronic device 3000, which may be considered such a host device. Device 3000 comprises clock-controlled circuitry 1000 or 2000 as considered earlier herein, connected to interact with other circuitry (not shown) of the electrical or electronic device 3000.

The skilled person will recognise that some aspects of the above described apparatus (circuitry) and methods may be embodied as processor control code, for example on a non-volatile carrier medium such as a disk, CD- or DVD-ROM, programmed memory such as read only memory (Firmware), or on a data carrier such as an optical or electrical signal carrier. For example, the configuration unit may be implemented as a processor operating based on processor control code.

For some applications, such aspects will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware.

Some embodiments of the present invention may be arranged as part of an audio processing circuit, for instance an audio circuit (such as a codec or the like) which may be provided in a host device as discussed above. A circuit or circuitry according to an embodiment of the present invention may be implemented as an integrated circuit (IC), for example on an IC chip. One or more input or output transducers may be connected to the integrated circuit in use.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

The invention claimed is:

1. Clock-controlled circuitry organised into at least first and second clock domains, the first clock domain configured to operate based on a first clock signal and the second clock domain configured to operate based on a second clock signal, wherein:
the first clock domain comprises a first signal generator operable to generate a first repetitive signal synchronised to the first clock signal;
the second clock domain comprises a second signal generator operable to generate a second repetitive signal synchronised to the second clock signal;
the first signal generator is operable, when operating in master mode, to output to the second signal generator a first synchronisation signal indicative of a phase of the first repetitive signal; and
the second signal generator is operable, when operating in slave mode, to:
set a timing of the second repetitive signal relative to the second clock signal based on the first synchronisation signal so that the second repetitive signal is set to have a phase relationship with the first repetitive signal which then meets a slave specification; and
re-set the timing of the second repetitive signal relative to the second clock signal if it is determined that the phase relationship has changed such that it no longer meets the slave specification.

2. The clock-controlled circuitry as claimed in claim 1, wherein the second signal generator is operable to re-set the timing of the second repetitive signal relative to the second clock signal based on the first synchronisation signal so that the second repetitive signal is again set to have a phase relationship with the first repetitive signal which then meets the slave specification.

3. The clock-controlled circuitry as claimed in claim 1, wherein the second signal generator, or another signal generator of the clock-controlled circuitry, is operable to monitor the phase relationship between the second repetitive signal and the first repetitive signal after the timing of the second repetitive signal relative to the second clock signal has been set and to determine if that phase relationship has changed such that it no longer meets the slave specification optionally wherein the second signal generator or the other signal generator is operable to monitor the phase relationship between the second repetitive signal and the first repetitive signal by monitoring a phase relationship between the second repetitive signal and the first synchronisation signal.

4. The clock-controlled circuitry as claimed in claim 3, wherein the second signal generator or the other signal generator is operable to monitor the phase relationship between the second repetitive signal and the first repetitive signal by monitoring a phase relationship between the second repetitive signal and a retimed first synchronisation signal being a retimed version of the first synchronisation signal.

5. The clock-controlled circuitry as claimed in claim 4, wherein the second signal generator or the other signal generator is operable to monitor the phase relationship between the second repetitive signal and the first repetitive signal by obtaining a count value indicative of the phase relationship by:
incrementing a counter between corresponding edges of the second repetitive signal and the first synchronisation signal or retimed first synchronisation signal; or
incrementing a counter while the second repetitive signal and the first synchronisation signal or retimed first synchronisation signal have the same value as one another; or
incrementing a counter while the second repetitive signal and the first synchronisation signal or retimed first synchronisation signal have different values from one another.

6. The clock-controlled circuitry as claimed in claim 1, wherein:
the first synchronisation signal is part or all of the first repetitive signal, or is derived from the first repetitive signal; or
the second signal generator is operable when operating in slave mode, to receive a release signal, and, if the release signal is received, to transition its operation to free-running mode, and in connection with the transition to free-running mode, to continue generation of the second repetitive signal at its existing timing relative to the second clock signal without taking account of the phase relationship between the second repetitive signal and the first repetitive signal.

7. The clock-controlled circuitry as claimed in claim 1, wherein the second signal generator is operable:
when operating in slave mode, to receive a re-synch signal indicating a change in the first repetitive signal, and, if the re-synch signal is received, to re-set the timing of the second repetitive signal relative to the second clock signal, optionally wherein the re-synch signal indicates a change in a repeating pattern of the first repetitive signal, and the second signal generator is operable, if the re-synch signal is received, to re-set the timing of the second repetitive signal relative to the second clock signal based on the re-synch signal and re-configure the second repetitive signal based on the change in the repeating pattern indicated by the re-synch signal.

8. The clock-controlled circuitry as claimed in claim 1, wherein the second signal generator is operable, when operating in slave mode, to monitor operation of the first signal generator, and, if the first signal generator is determined to become disabled, to:
   transition its operation to master mode; and then
   continue generation of the second repetitive signal at its existing timing relative to the second clock signal without taking account of the phase relationship between the second repetitive signal and the first repetitive signal, and output a second synchronisation signal indicative of a phase of the second repetitive signal.

9. The clock-controlled circuitry as claimed in claim 8, wherein the first signal generator is operable, when re-enabled after being disabled, to:
   monitor operation of the second signal generator and determine if the second clock control circuit is operating in master mode; and
   when it is determined that the second clock control circuit is operating in master mode, operate in slave mode.

10. The clock-controlled circuitry as claimed in claim 9, wherein the first signal generator is operable, when operating in slave mode, to:
    set a timing of the first repetitive signal relative to the first clock signal based on the second synchronisation signal so that the first repetitive signal is set to have a phase relationship with the second repetitive signal which then meets the slave specification; and
    re-set the timing of the first repetitive signal relative to the first clock signal if it is determined that that phase relationship has changed such that it no longer meets the slave specification, optionally wherein the first signal generator is operable to re-set the timing of the first repetitive signal relative to the first clock signal based on the second synchronisation signal so that the first repetitive signal is again set to have a phase relationship with the second repetitive signal which then meets the slave specification.

11. The clock-controlled circuitry as claimed in claim 10, wherein the first signal generator, or another signal generator of the clock-controlled circuitry, is operable to monitor the phase relationship between the first repetitive signal and the second repetitive signal after the timing of the first repetitive signal relative to the first clock signal has been set and to determine if that phase relationship has changed such that it no longer meets the slave specification.

12. The clock-controlled circuitry as claimed in claim 11, wherein the first signal generator or that other signal generator is operable to monitor the phase relationship between the first repetitive signal and the second repetitive signal by monitoring a phase relationship between the first repetitive signal and the second synchronisation signal.

13. The clock-controlled circuitry as claimed in claim 11, wherein the first signal generator or that other signal generator is operable to monitor the phase relationship between the first repetitive signal and the second repetitive signal by monitoring a phase relationship between the first repetitive signal and a retimed second synchronisation signal being a retimed version of the second synchronisation signal.

14. The clock-controlled circuitry as claimed in claim 13, wherein the first signal generator or that other signal generator is operable to monitor the phase relationship between the first repetitive signal and the second repetitive signal by obtaining a count value indicative of the phase relationship by:
    incrementing a counter between corresponding edges of the first repetitive signal and the second synchronisation signal or retimed second synchronisation signal; or
    incrementing a counter while the first repetitive signal and the second synchronisation signal or retimed second synchronisation signal have the same value as one another; or
    incrementing a counter while the first repetitive signal and the second synchronisation signal or retimed second synchronisation signal have different values from one another.

15. The clock-controlled circuitry as claimed in claim 8, wherein the second synchronisation signal is part or all of the second repetitive signal, or is derived from the second repetitive signal.

16. The clock-controlled circuitry as claimed in claim 1, wherein the first signal generator and second signal generator are operable to generate the first and second clock signals, respectively, based on the same global clock signal, or the first repetitive signal comprises a plurality of different component repetitive signals synchronised with the first clock signal, and/or the second repetitive signal comprises a plurality of different component repetitive signals synchronised with the second clock signal.

17. The clock-controlled circuitry as claimed in claim 1, organised into at least first and second power domains, wherein the first power domain comprises the first clock domain and the second power domain comprises the second clock domain optionally comprising first and second IC chips, wherein the first IC chip comprises the first power domain and the second IC chip comprises the second power domain.

18. The clock-controlled circuitry as claimed in claim 1, comprising a first data communication unit in the first clock domain and configured to operate based on the first clock signal, and a second data communication unit in the second clock domain and configured to operate based on the second clock signal, wherein:
    the first data communication unit is operable to process a first data signal which is synchronous with the first clock signal, based on the first repetitive signal;
    the second data communication unit is configured to process a second data signal which is synchronous with the second clock signal, based on the second repetitive signal; and
    the first and second communication units are configured to transfer such a data signal between them based on their respective first and second repetitive signals and via a retiming circuit so that the first data signal becomes the second data signal or vice versa, optionally wherein the data signals are audio data signals, and wherein the clock-controlled circuitry is clock-controlled audio circuitry, and optionally wherein the audio data signals are organised into frames, and wherein the first and second data communication units are configured to align the frames in their respective audio data signals with their respective repetitive signals.

19. The clock-controlled circuitry as claimed in claim 1, comprising storage for storing information defining the slave specification, wherein:
    the first signal generator and/or the second signal generator is configured to set the timing concerned based on the information; and/or the determination that a said phase relationship has changed such that it no longer meets the slave specification is made based on the information.

20. A method of controlling clock-controlled circuitry which is organised into at least first and second clock domains, the first clock domain configured to operate based on a first clock signal and the second clock domain configured to operate based on a second clock signal, wherein:

the first clock domain comprises a first signal generator operable to generate a first repetitive signal synchronised to the first clock signal;

the second clock domain comprises a second signal generator operable to generate a second repetitive signal synchronised to the second clock signal; and the first signal generator is operable, when operating in master mode, to output to the second signal generator a first synchronisation signal indicative of a phase of the first repetitive signal, the method comprising controlling the second signal generator, when operating in slave mode, to:

set a timing of the second repetitive signal relative to the second clock signal based on the first synchronisation signal so that the second repetitive signal is set to have a phase relationship with the first repetitive signal which then meets a slave specification; and re-set the timing of the second repetitive signal relative to the second clock signal if it is determined that the phase relationship has changed such that it no longer meets the slave specification.

* * * * *